United States Patent
Liu

(10) Patent No.: US 9,214,386 B2
(45) Date of Patent: *Dec. 15, 2015

(54) SEMICONDUCTOR CONSTRUCTIONS AND METHODS OF FORMING ELECTRICALLY CONDUCTIVE CONTACTS

(71) Applicant: Micron Technology, Inc., Boise, ID (US)

(72) Inventor: Zengtao T. Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/788,960

(22) Filed: Jul. 1, 2015

(65) Prior Publication Data

US 2015/0303100 A1    Oct. 22, 2015

Related U.S. Application Data

(63) Continuation of application No. 13/975,503, filed on Aug. 26, 2013, now Pat. No. 9,105,636.

(51) Int. Cl.
| | |
|---|---|
| *H01L 29/40* | (2006.01) |
| *H01L 21/768* | (2006.01) |
| *H01L 23/532* | (2006.01) |
| *H01L 23/522* | (2006.01) |
| *H01L 23/528* | (2006.01) |

(52) U.S. Cl.
CPC .... *H01L 21/76834* (2013.01); *H01L 21/76802* (2013.01); *H01L 21/76844* (2013.01); *H01L 21/76877* (2013.01); *H01L 23/528* (2013.01); *H01L 23/5226* (2013.01); *H01L 23/53238* (2013.01)

(58) Field of Classification Search
CPC ............... H01L 23/5226; H01L 23/53257; H01L 23/53271; H01L 21/76877; H01L 27/101
USPC .......................................... 257/762; 438/667
See application file for complete search history.

(56) References Cited

U.S. PATENT DOCUMENTS

| | | | |
|---|---|---|---|
| 6,184,584 | B1 | 2/2001 | Sakao |
| 6,251,790 | B1 | 6/2001 | Jeong |
| 6,255,226 | B1 | 7/2001 | Zheng et al. |
| 8,338,225 | B2 | 12/2012 | Breitwisch et al. |

(Continued)

FOREIGN PATENT DOCUMENTS

| | | |
|---|---|---|
| JP | 2004-031638 | 1/2004 |
| KR | 10-2005-0063129 | 6/2006 |
| WO | PCT/US2014/040371 | 9/2014 |

*Primary Examiner* — Trung Q Dang
(74) *Attorney, Agent, or Firm* — Wells St. John P.S.

(57) ABSTRACT

Some embodiments include methods of forming electrically conductive contacts. An opening is formed through an insulative material to a conductive structure. A conductive plug is formed within a bottom region of the opening. A spacer is formed to line a lateral periphery of an upper region of the opening, and to leave an inner portion of an upper surface of the plug exposed. A conductive material is formed against the inner portion of the upper surface of the plug. Some embodiments include semiconductor constructions having a conductive plug within an insulative stack and against a copper-containing material. A spacer is over an outer portion of an upper surface of the plug and not directly above an inner portion of the upper surface. A conductive material is over the inner portion of the upper surface of the plug and against an inner lateral surface of the spacer.

18 Claims, 13 Drawing Sheets

(56) References Cited

U.S. PATENT DOCUMENTS

| | | |
|---|---|---|
| 8,420,947 B2 | 4/2013 | Srivastava |
| 8,445,380 B2 | 5/2013 | Hsieh et al. |
| 9,105,636 B2 * | 8/2015 | Liu .................... H01L 23/5226 |
| 2007/0020975 A1 | 1/2007 | Chung et al. |
| 2007/0093050 A1 | 4/2007 | Son et al. |
| 2007/0173057 A1 | 7/2007 | Lee et al. |
| 2010/0055902 A1 | 3/2010 | Frohberg et al. |
| 2012/0061744 A1 | 3/2012 | Hwang et al. |
| 2012/0063194 A1 | 3/2012 | Baek et al. |
| 2012/0241978 A1 | 9/2012 | Mino |
| 2013/0009230 A1 | 1/2013 | Cleeves et al. |

\* cited by examiner

SEMICONDUCTOR CONSTRUCTIONS AND METHODS OF FORMING ELECTRICALLY CONDUCTIVE CONTACTS

RELATED PATENT DATA

This patent resulted from a continuation of U.S. patent application Ser. No. 13/975,503, which was filed Aug. 26, 2013, which issued as U.S. Pat. No. 9,105,636; and which is hereby incorporated herein by reference.

TECHNICAL FIELD

Semiconductor constructions and methods of forming electrically conductive contacts.

BACKGROUND

Memory is often incorporated into integrated circuitry. The memory may be used, for example, in computer systems for storing data.

Memory may be provided as a large array of memory cells. Wordlines and bitlines may be provided across the array such that individual memory cells may be uniquely addressed through the combination of a wordline and a bitline.

Numerous types of memory are available. An example class of memory is resistive random access memory (RRAM), which is of interest for utilization in existing and future data storage needs. RRAM utilizes programmable material having two or more stable states that differ in resistivity relative to one another. Example types of memory cells that may be utilized in RRAM are phase change memory (PCM) cells, programmable metallization cells (PMCs), conductive bridging random access memory (CBRAM) cells, nanobridge memory cells, electrolyte memory cells, binary oxide cells, and multilayer oxide cells (for instance, cells utilizing multivalent oxides). The memory cell types are not mutually exclusive. For example, CBRAM and PMC are overlapping classification sets.

A continuing goal of integrated circuit fabrication is to increase the level of integration (i.e., to scale circuitry to smaller dimensions). Wordlines and bitlines may become increasingly tightly packed across a memory array with increasing levels of integration. The wordlines and bitlines are electrically coupled with circuitry external to the memory array and are utilized to transfer electrical signals to and from the memory array during read/write operations. Difficulties are encountered in increasing the level of integration of memory in that it becomes increasingly difficult to make suitable connections from circuitry external of the memory array to the wordlines and bitlines. It is desired to develop new architectures suitable for making connections to wordlines and bitlines, and new methods of fabricating such architectures. It is also desirable for the architectures to be suitable for making connections to integrated circuit components other than wordlines and bitlines.

DETAILED DESCRIPTION OF THE ILLUSTRATED EMBODIMENTS

In some embodiments, the invention includes new methods of forming electrical contact between highly integrated structures and circuitry peripheral to such highly integrated structures, and includes new structural configurations formed by such methods. The highly integrated structures may include conductive lines, such as, for example, signal lines and/or buses of signal lines. In some embodiments, the highly integrated structures may include access lines (i.e., wordlines) and/or data lines (i.e., bitlines). Example embodiments are described with reference to FIGS. 1-25.

Figure 1:
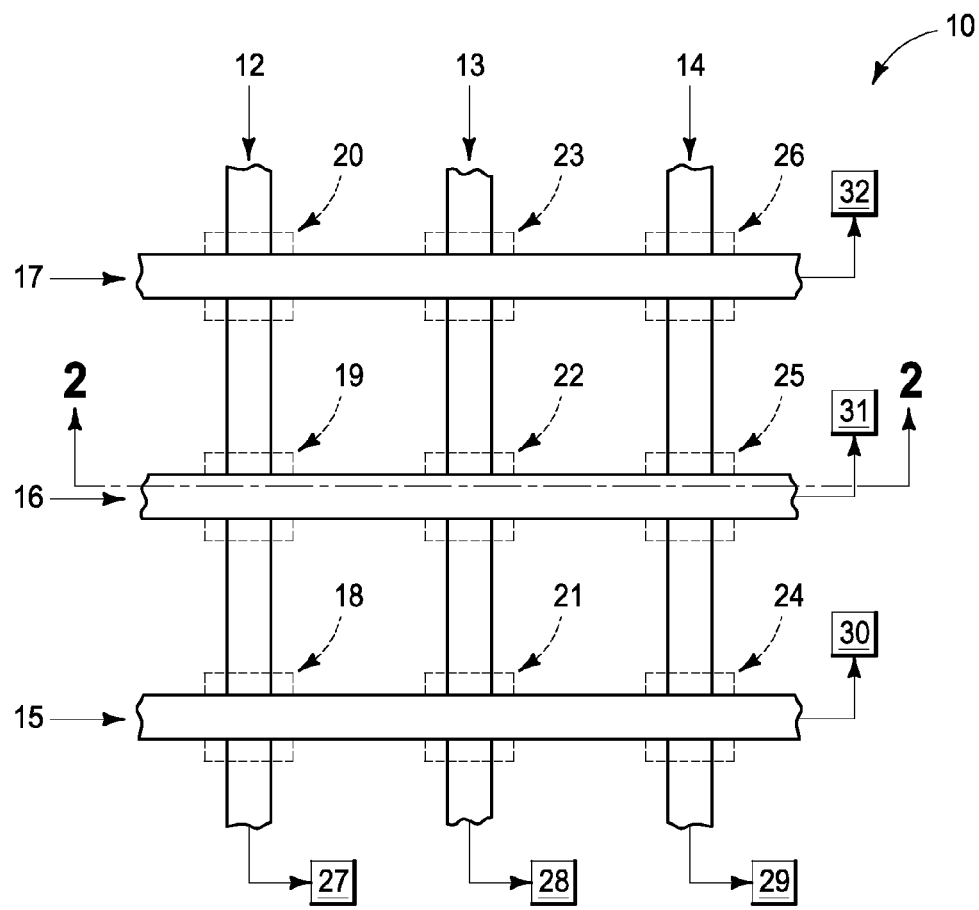
FIG. 1 is a diagrammatic top view of an integrated memory array.
Figure 2:
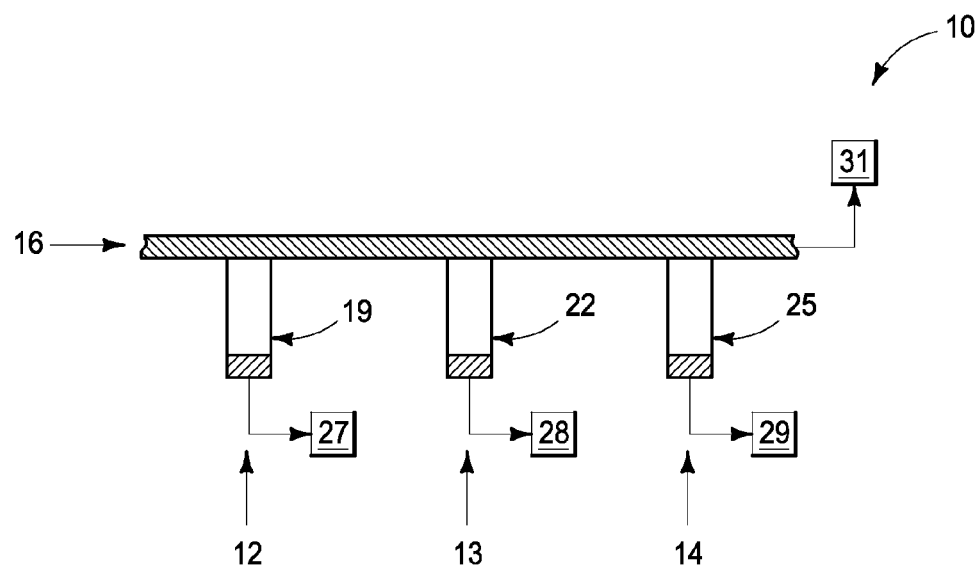
FIG. 2 is a cross-sectional side view along the line 2-2 of FIG. 1.

Referring to FIGS. 1 and 2, a portion of an example embodiment memory array 10 is shown in top view (FIG. 1) and cross-sectional side view (FIG. 2). The memory array comprises a first series of lines 12-14 extending along a first direction, and a second series of lines 15-17 extending along a second direction substantially orthogonal to the first direction. The term "substantially orthogonal" means that the first and second directions are orthogonal to one another within reasonable tolerances of fabrication and measurement.

In some embodiments, the first series of lines (12-14) may correspond to wordlines, and the second series of lines (15-17) may correspond to bitlines, or vice versa.

Memory cells 18-26 are formed at regions where the wordlines and bitlines cross one another. The memory cells may comprise any suitable configurations, and in some embodiments may correspond to RRAM cells; such as, for example, PCM cells, PMC cells, CBRAM cells, etc. In some embodiments other structures may be between the wordlines and bitlines besides the memory cells. For instance, select devices (such as, for example, diodes, transistors, switches, etc.) may be adjacent the memory cells to restrict leakage to and/or from the memory cells.

The wordlines and bitlines are connected to peripheral circuitry through contacts generically illustrated with boxes 27-32. The peripheral circuitry will generally be at a looser pitch (i.e. will be less highly integrated) than the wordlines and bitlines, and problems may be encountered in prior art processing in attempting to electrically couple the relatively loosely spaced peripheral circuitry with the relatively tightly spaced wordlines and bitlines. Various architectural features have been developed for such coupling, including so-called shark jaw features, staircase features, socket features, etc. However, all of such architectural features consume substantial semiconductor real estate, and accordingly it is desired to develop new methods for coupling peripheral circuitry with wordlines and bitlines. Although various embodiments were developed for establishing coupling between peripheral circuitry and the wordlines and bitlines of a memory array, it is to be understood that the various structures and methods described herein may be applied to other applications. In some embodiments, it is the coupling which is pertinent to the invention, independent of the type of device/application utilizing such coupling. In some applications, the various coupling structures and methods described herein may be particularly useful for coupling lines carrying logic and/or analog signals, such as in signal buses and/or in analog circuitry.

An example embodiment method of forming a contact is described with reference to FIGS. 3-16.

Figure 3:
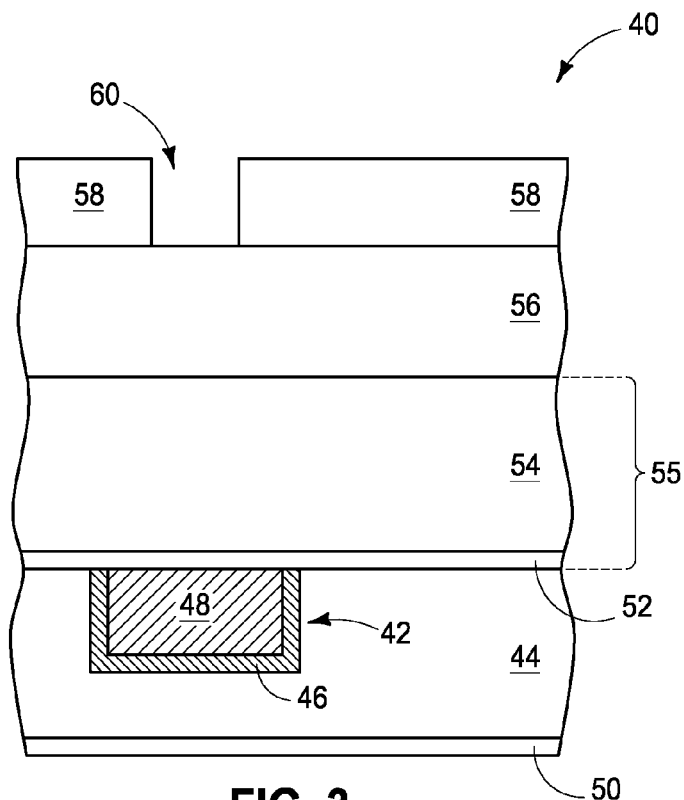
FIGS. 3-8 and 10-12 are diagrammatic cross-sectional views of a semiconductor construction at various process stages of an example embodiment.

FIG. 3 shows a construction 40 comprising an electrically conductive structure 42 within an electrically insulative material 44. The electrically conductive structure may be part of a line extending in and out of the page relative to the cross-sectional view of FIG. 3, and in some embodiments may be comprised by circuitry peripheral to a memory array. In the shown embodiment, the electrically conductive structure 42 comprises a first electrically conductive material 46 extending around a second electrically conductive material 48. The second electrically conductive material 48 may comprise, consist essentially of, or consist of copper; and the first electrically conductive material 46 may be a barrier to prevent copper diffusion from the first material to the electrically insulative material 44. Numerous electrically conductive copper barrier materials are known, and such materials may comprise, for example, ruthenium, platinum, iridium, tantalum, etc.

Although the shown electrically conductive structure 42 comprises two materials, in other embodiments the electrically conductive structure may comprise only a single electrically conductive composition, and in yet other embodiments the electrically conductive structure may comprise more than two materials. Further, although copper is described as a suitable material for the electrically conductive structure, it is to be understood that any suitable materials may be utilized in the electrically conductive structure, including, for example, one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.).

The electrically insulative material 44 may comprise any suitable composition or combination of compositions; including, for example, one or more of silicon dioxide, silicon nitride, metal oxide (for instance, aluminum oxide), etc.

That electrically insulative material 44 is supported by a base 50. The base 50 may comprise semiconductor material, and in some embodiments may comprise, consist essentially of, or consist of monocrystalline silicon. In some embodiments, the base 50 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, the base 50 may correspond to a semiconductor substrate containing one or more materials associated with integrated circuit fabrication. Some of the materials may be under the shown region of base 50, may be between the base and the insulative material 44, and/or may be laterally adjacent the shown region of base 50; and may correspond to, for example, one or more of refractory metal materials, barrier materials, diffusion materials, insulator materials, etc.

An electrically insulative barrier material 52 is over conductive structure 42, and comprises a suitable composition to block diffusion from copper-containing material 48. In some embodiments, the barrier material 52 may comprise buried low-k (Blok) material, such as, for example, a material comprising silicon and carbon and hydrogen. The barrier material 52 may be omitted in embodiments in which structure 42 does not comprise a copper-containing material.

An electrically insulative material 54 is over material 52. Material 54 may comprise any suitable composition or combination of compositions; and in some embodiments may comprise, consist essentially of, or consist of silicon dioxide. In some embodiments, the materials 52 and 54 may be considered together as a stack 55.

A carbon-containing material 56 is over insulative material 54. The carbon-containing material 56 may comprise, for example, transparent carbon.

Patterned masking material 58 is over carbon-containing material 56. The masking material 58 may comprise any suitable composition or combination of compositions, and in some embodiments may comprise photolithographically-patterned photoresist.

An opening 60 extends through patterned masking material 58, and such opening is directly over conductive structure 42.

Figure 4:
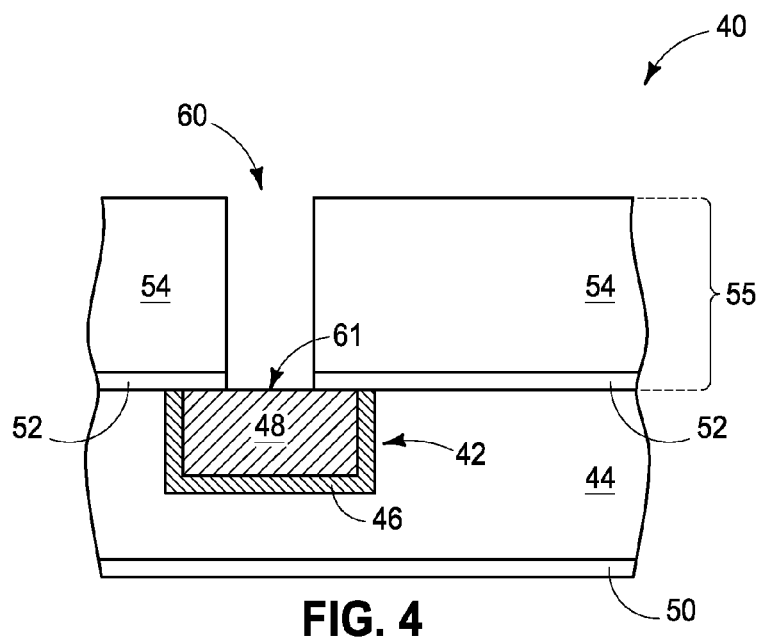

Referring to FIG. 4, opening 60 is transferred through stack 55 with one or more suitable etches, and materials 56 and 58 (FIG. 3) are removed. In the shown embodiment, the opening has vertical sidewalls along the materials 52 and 54, but in other embodiments the sidewalls may be tapered or otherwise non-vertical. In some embodiments, a first etch may be utilized to extend through material 54, and a second etch may be utilized to extend through material 52, and the second etch may form recesses or cavities (not shown) under material 54. Regardless, the opening 60 exposes an upper surface 61 of the conductive structure 42. In the shown embodiment, the exposed upper surface corresponds to an upper surface of copper-containing material 48.

Figure 5:
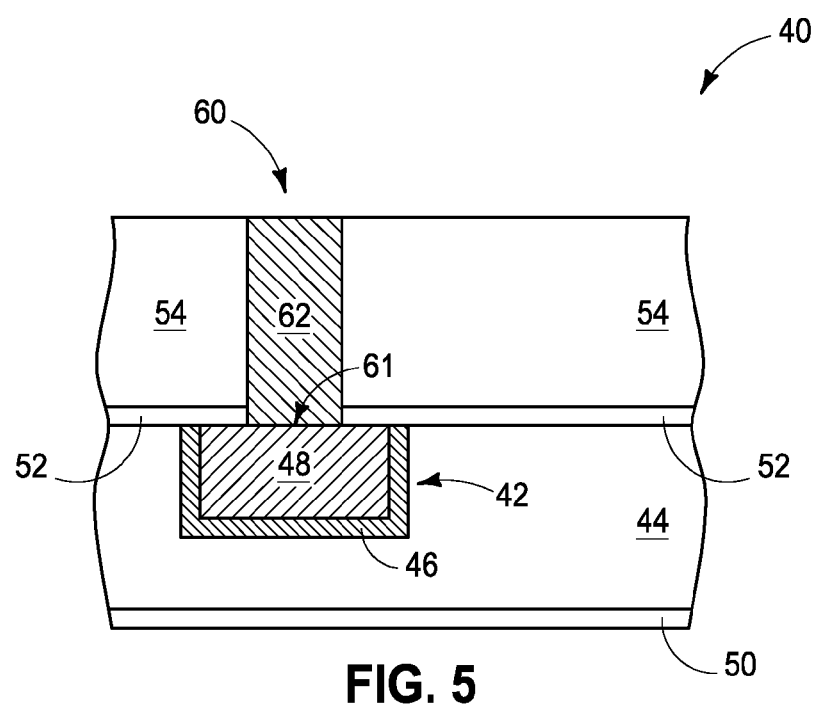

Referring to FIG. 5, electrically conductive material 62 is formed within opening 60 and directly against the exposed region of the upper surface 61 of conductive structure 42. In the shown embodiment, the electrically conductive material is only within opening 60, and not across an upper surface of insulative material 54. In other embodiments, the conductive material 62 may extend across upper surface of material 54 as well as within opening 60. The conductive material 62 may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). In some embodiments, the conductive material 62 may comprise, consist essentially of, or consist of titanium nitride. An advantage of titanium nitride is that such may adhere well to copper-containing material.

Figure 6:
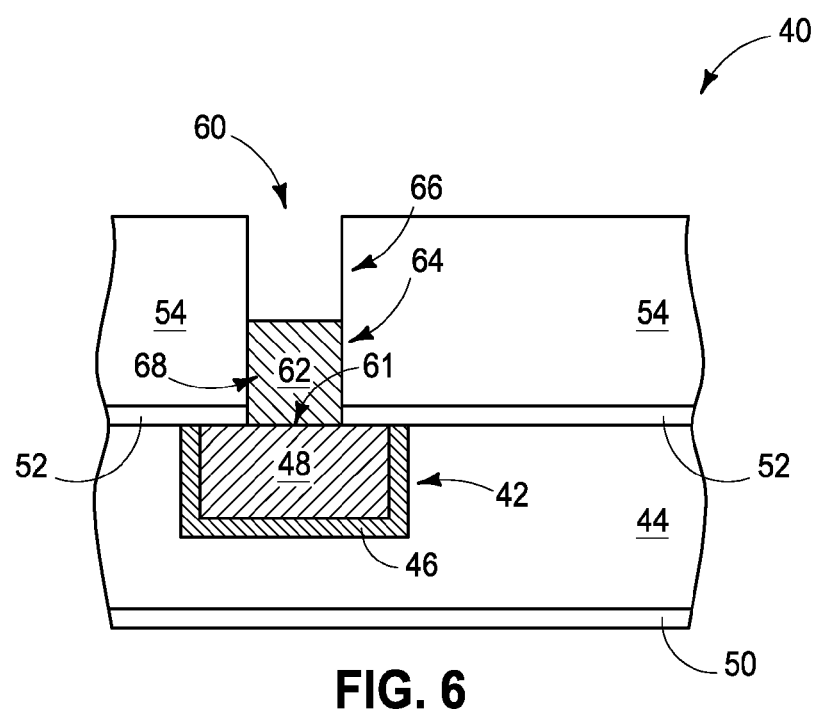

Referring to FIG. 6, the electrically conductive material 62 is recessed within opening 60. Such recessing may be encompassed with any suitable etch or combination of etches; including, for example, one or both of wet etching and dry etching. The recessed material 62 may be considered to be within a bottom region 64 of opening 60, and to leave a top region 66 of the opening empty. In some embodiments, the recessed material 62 may be considered to form a plug 68 within the bottom region 64 of opening 60.

In the shown embodiment, the recessed material 62 has a substantially planar upper surface. In other embodiments, the upper surface may be concave, convex, or of a roughened topography. If the topography has pinholes or voids extending therein, additional processing may be utilized to eliminate such features. For instance, planarization (for instance, chemical-mechanical polishing) may be conducted across material 62 prior to the recessing of material 62.

Figure 7:
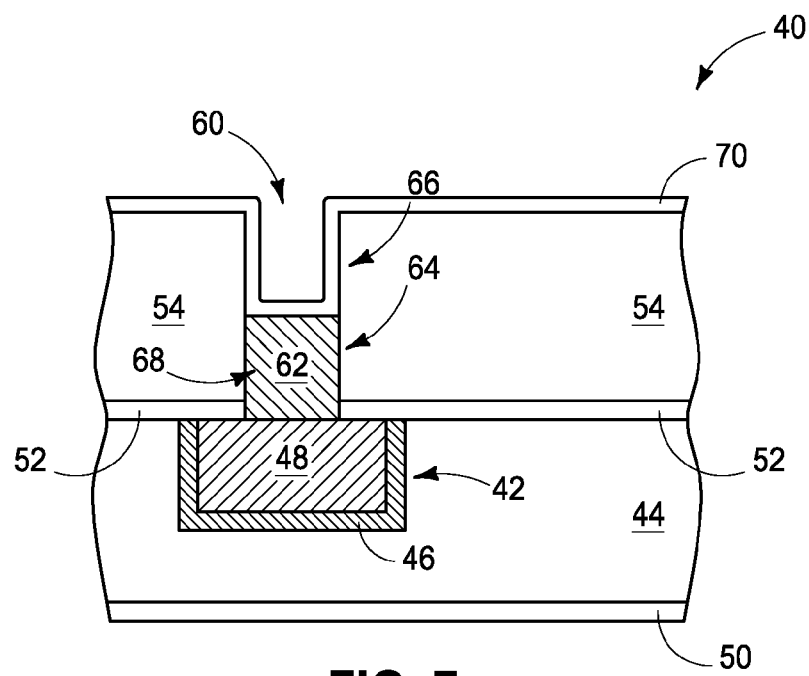

Referring to FIG. 7, spacer material 70 is formed across an upper surface of insulative material 54 and within opening 60. The spacer material lines the sidewalls and bottom of the upper region 66 of the opening. The spacer material 70 may comprise any suitable composition or combination of compositions, and may be electrically insulative in some embodiments. For instance, the spacer material 70 may comprise, consist essentially of, or consist of silicon dioxide or silicon nitride.

Figure 8:
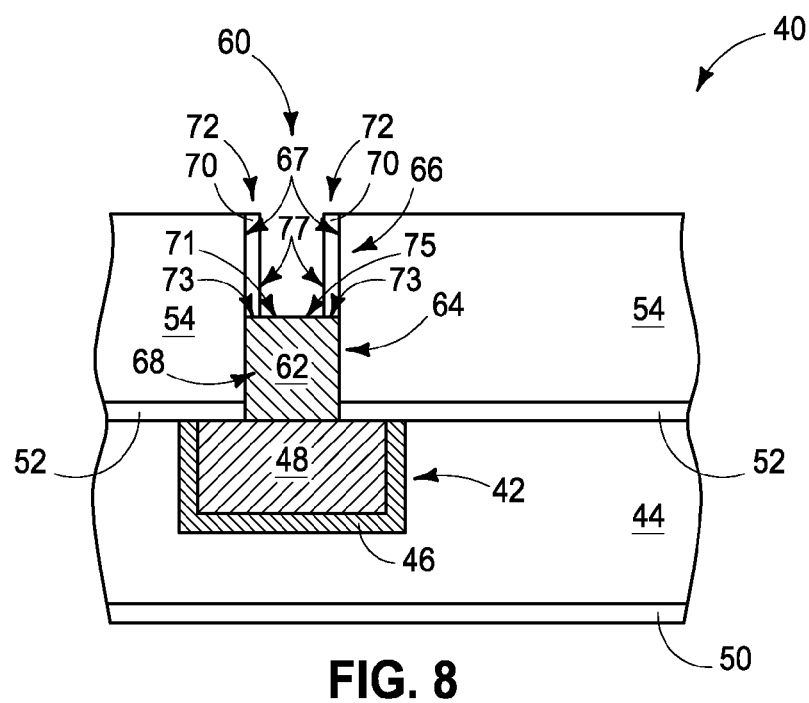

Referring to FIG. 8, the spacer material 70 is anistropically etched to form a spacer 72 which lines a lateral periphery 67 of the upper region 66 of opening 60. The spacer narrows the upper region 66 of opening 60 relative to the lower region 64 of the opening.

Figure 9:
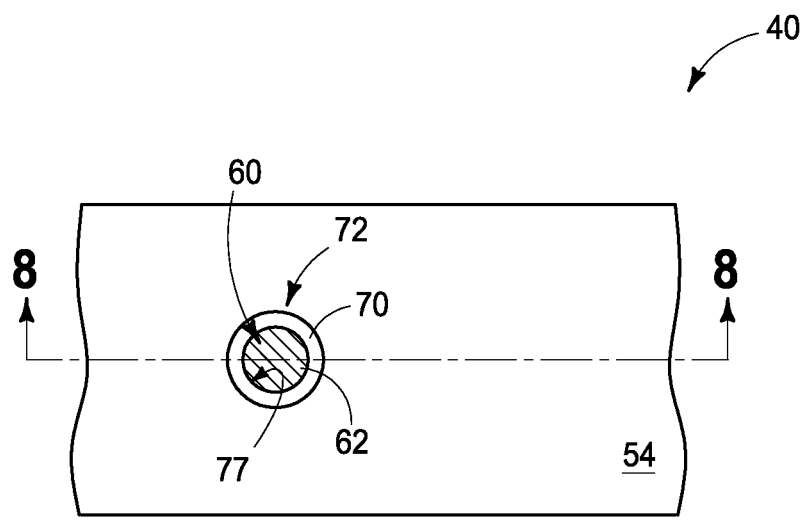
FIG. 9 is a diagrammatic top view of the construction of FIG. 8 (with the view of FIG. 8 being along the line 8-8 of FIG. 9).

FIG. 9 shows a top view of the construction of FIG. 8, and shows opening 60 having a closed shape (with the opening having a circular shape in the shown embodiment, but the opening may have other shapes in other embodiments, including, for example, elliptical, square, rectangular, polygonal, complex curved, etc.).

Referring again to FIG. 8, the spacer 70 is over an outer portion 73 of an upper surface 71 of plug 68, and leaves an inner portion 75 of upper surface 71 exposed. The spacer has an inner lateral surface 77.

Figure 10:
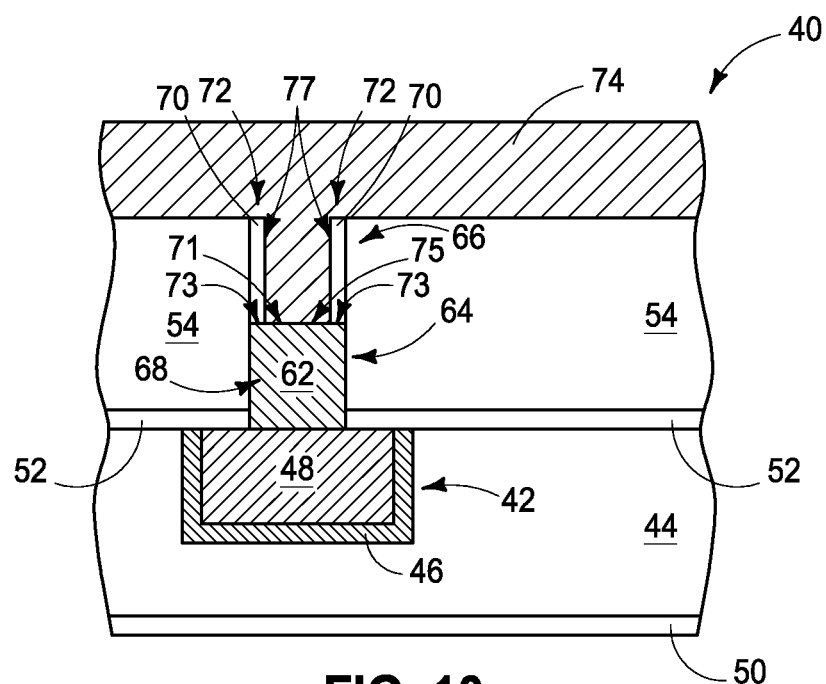

Referring to FIG. 10, electrically conductive material 74 is formed within the lined upper region 66 of opening 60 and directly against the inner portion 75 of the upper surface 71 of plug 68. The electrically conductive material 74 is also against the inner lateral surface 77 of spacer 72, and in the shown embodiment extends across an upper surface of insulative material 54.

The electrically conductive material 74 may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). In some embodiments, material 74 may comprise, consist essentially of, or consist of tungsten. Tungsten may be advantageous in some embodiments in that tungsten has relatively high conductivity, and can be more cost-effective than some other metals having high conductivity. Although material 74 is shown to be homogenous, in other embodiments (not shown), the conductive material 74 may comprise two or more discrete electrically conductive compositions. For instance, material 74 may comprise tungsten and titanium. In some applications, material 74 may comprise tungsten over titanium, with the titanium being directly against material 62 and the tungsten being directly against the titanium. In such applications, both the tungsten and the titanium may extend into the lined upper region 66 of opening 60.

Figure 11:
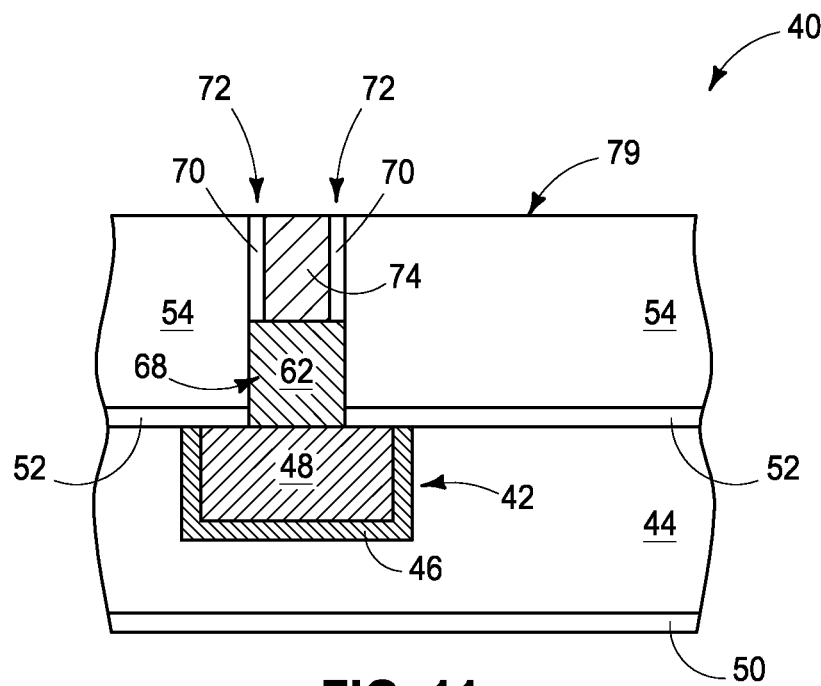

Referring to FIG. 11, chemical-mechanical polishing (CMP) and/or other suitable planarization is utilized to remove conductive material 74 from over insulative material 54, and to form a planarized upper surface 79 extending across materials 54, 70 and 74. A difficulty in some conventional processes is that it can be difficult to etch or otherwise process TiN during fabrication of connecting circuitry (for instance, wordlines and/or bitlines) without creating electrically conductive TiN stringers. Such stringers may create shorts across conductive structures, destroying operability of an integrated circuit. In the illustrated embodiment, such processing of TiN may be avoided. Specifically, if a TiN-containing plug 68 is utilized for adhesion to the copper, such plug is recessed below the material 74. Accordingly, it is only material 74 exposed to subsequent processing during fabrication of connecting circuitry, and not the TiN-containing plug 68.

Figure 12:
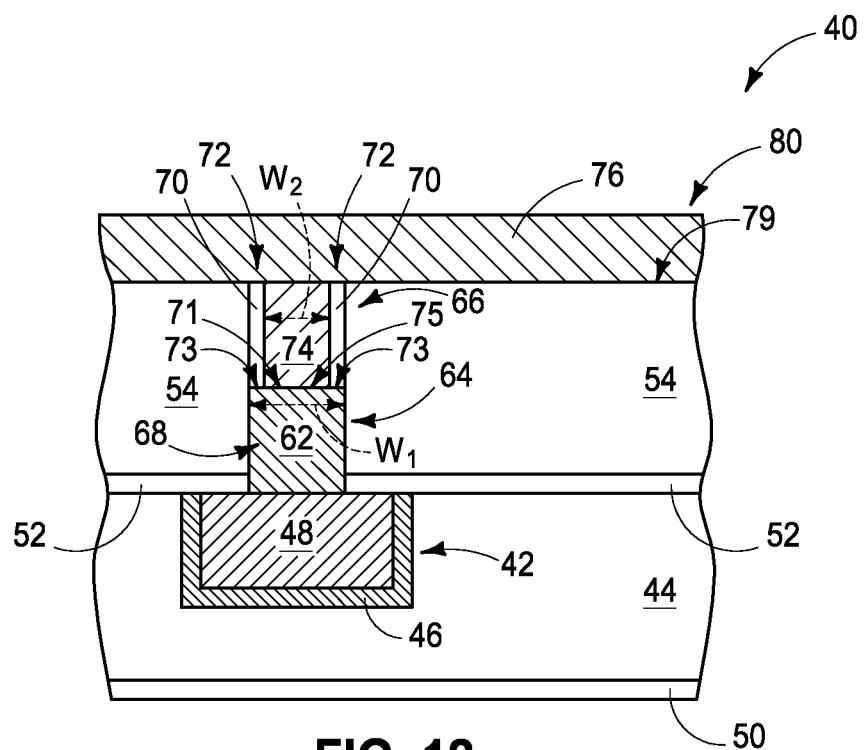

Referring to FIG. 12, electrically conductive material 76 is formed over planarized surface 79 and patterned into an electrically conductive line 80. The electrically conductive material 76 may comprise any suitable electrically conductive material, including, for example, one or more of various metals, metal-containing compositions and conductively-doped semiconductor materials. In some embodiments, the line 80 may correspond to a wordline or a bitline, and may extend to a memory array (as described in more detail with reference to FIGS. 15 and 16).

In some embodiments, the construction of FIG. 12 may be considered to comprise the electrically conductive plug 68 having a first width $W_1$ along the cross-section of FIG. 12. The upper surface 71 of the plug comprises the outer portion 73 covered by spacer 72, and the inner portion 75 which is not covered by the spacer, and which is directly against conductive material 74. The inner portion 75 and the conductive material 74 have widths along the cross-section of FIG. 12 of $W_2$; which corresponds to a second width which is less than the first width $W_1$. In some embodiments, the second width $W_2$ may be within a range of from about 50% to about 90% of $W_1$.

Figure 13:
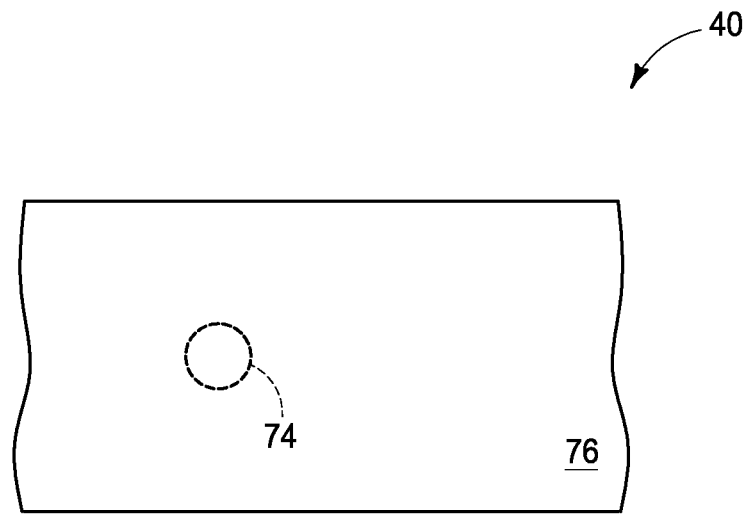
FIG. 13 is a diagrammatic top view of a construction at a processing stage subsequent to that of FIG. 11.
Figure 14:
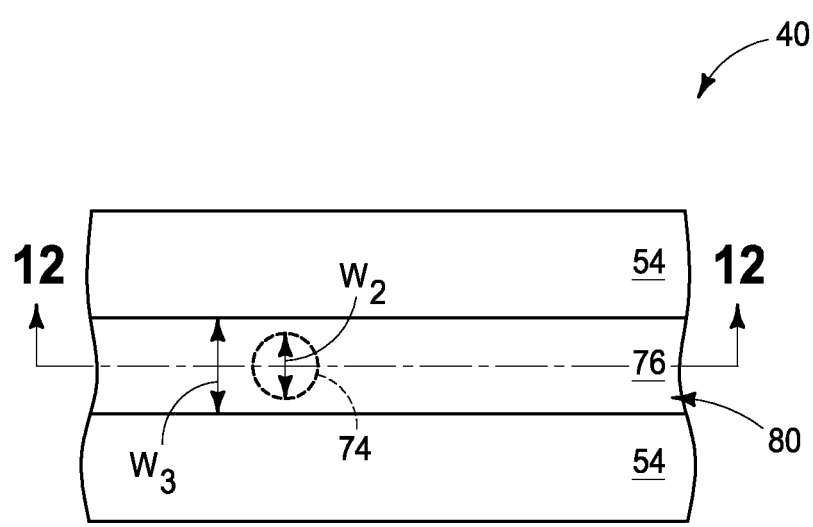
FIG. 14 is a diagrammatic top view of a construction at a processing stage subsequent to that of FIG. 13, and is a top view of the construction at the processing stage of FIG. 12 (with the view of FIG. 12 being along the line 12-12 of FIG. 14).

The patterning of material 76 into a line may be accomplished with any suitable processing. FIGS. 13 and 14 show a top view of construction 40, and describe an example process for forming line 80. FIG. 13 shows conductive material 76 formed entirely across the top surface of construction 40, and diagrammatically illustrates an outer edge of the conductive material 74 in dashed-line view (with the dashed-line view indicating that material 74 is beneath material 76).

FIG. 14 shows construction 40 at a processing stage subsequent to that of FIG. 13 (and specifically, shows the construction at the processing stage described above with reference to FIG. 12). FIG. 14 shows the material 76 patterned into the line 80 that extends across materials 54 and 74. The patterning of line 80 may be accomplished utilizing a patterned mask (not shown) and one or more suitable etches to transfer a pattern from the mask through material 76. The mask may comprise photolithographically-patterned photoresist, and/or materials associated with pitch-multiplication methodologies. Accordingly, line 80 may be formed to lithographic dimensions or to sublithographic dimensions. The shown line 80 may be one of a series of lines, and may, for example, be an example bitline of a series of bitlines extending across a memory array, or an example wordline of a series of wordlines extending across the memory array. The top view of FIG. 14 shows that the line 80 comprises a third width, $W_3$, which is larger than the second width, $W_2$, of conductive material 74 in the illustrated example embodiment (i.e., the line 80 is wider than the upper surface of the contact comprising material 74). In some embodiments, there may be less risk of detrimental misalignment errors in aligning the wider lines to the narrower upper surfaces of the contacts than would be the case if the lines and upper surfaces of the contacts were of similar widths to one another.

Figure 15:
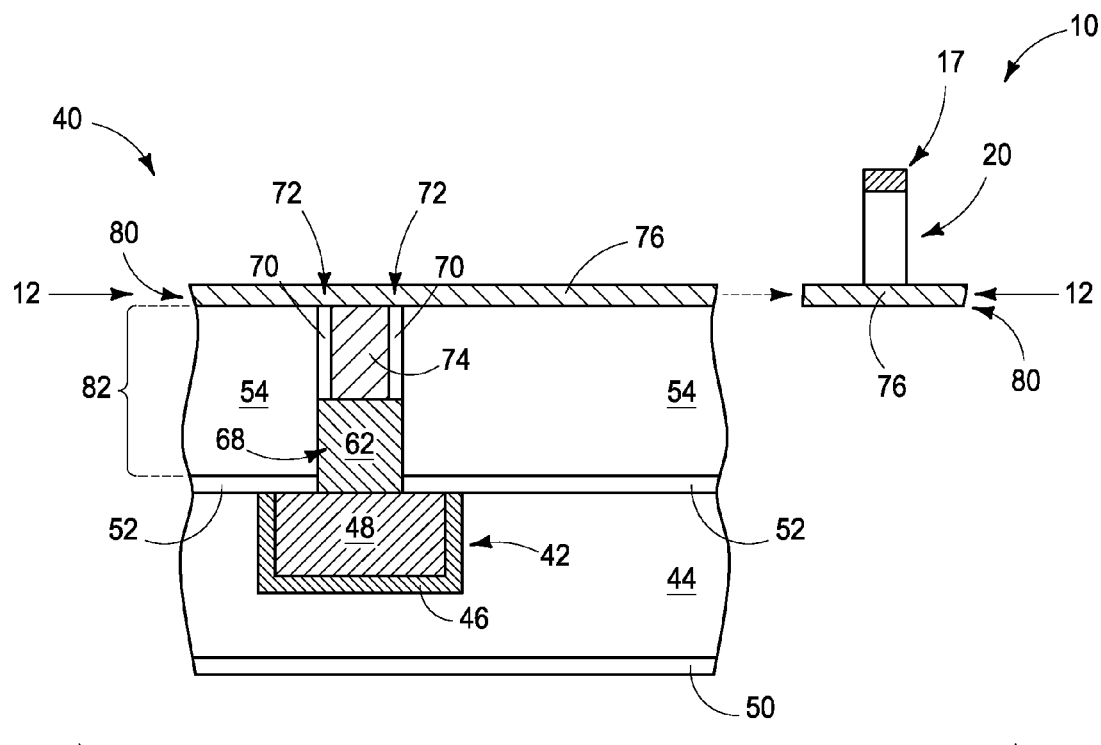
FIGS. 15 and 16 are diagrammatic cross-sectional views of example embodiments for utilizing the structure of FIG. 12 with a memory array.

FIG. 15 shows construction 40 in combination with a portion of a memory array 10 of the type described above with reference to FIGS. 1 and 2, and specifically shows line 80 being configured as the wordline 12 which extends across the memory array 10. The illustrated wordline extends under a memory cell 20, and the shown region of the wordline is also under a bitline 17. In the shown embodiment, wordline 12 is electrically connected to conductive structure 42 through an electrical contact 82 comprising electrically conductive material 74 and electrically conductive plug 68. The structure 42 may correspond to a region of the peripheral circuitry 27 described above with reference to FIG. 1.

Figure 16:
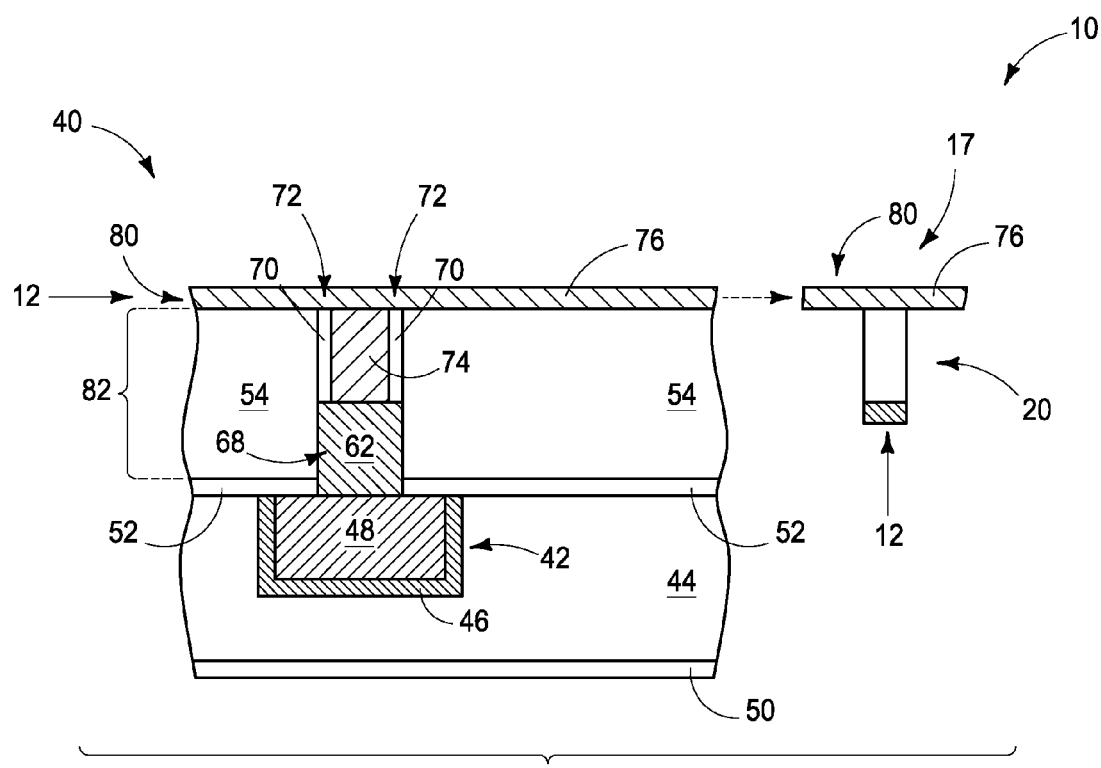

FIG. 16 shows a configuration similar to that of FIG. 15, except that line 80 is now part configured as the bitline 17 extending across the memory array 10. The bitline is electrically coupled to conductive structure 42 through the electrical contact 82 comprising electrically conductive material 74 and electrically conductive plug 68. The structure 42 of FIG. 16 may correspond to a region of the peripheral circuitry 32 described above with reference to FIG. 1.

An advantage of utilizing the electrical contacts of FIGS. 15 and 16 for connecting wordlines and/or bitlines to electrically conductive structures (for instance, the structure 42) is that the contacts may be formed on a same pitch as the wordlines and bitlines. The utilization of wider conductive material at the bottom of the contacts (specifically, the conductive material of the plug 68) can simplify processing, in that it can be easier to form material at the bottom of the wide opening as compared to forming the material at the bottom of a narrow opening (specifically, it can be easier to form conductive material within an opening having a lower aspect ratio as compared to forming the material in an opening having a higher aspect ratio). Further, the narrowed conductive material at the top of the contacts (specifically, the material 74) enables the contacts to be formed with narrow upper dimensions which can fit on a same pitch as tightly-pitched wordlines and bitlines. Thus, utilization of contacts having two conductive materials (68 and 74) with different cross-sectional widths relative to one another can be advantageous as compared to conventional methods.

The embodiment of FIGS. 5-12 utilizes a conductive plug 68 consisting of only a single material (for instance, titanium nitride). In other embodiments an analogous conductive plug may be formed to comprise two or more different electrically conductive materials. For instance, FIGS. 17-20 describe an embodiment in which a conductive plug is formed to comprise two different electrically conductive materials.

Figure 17:
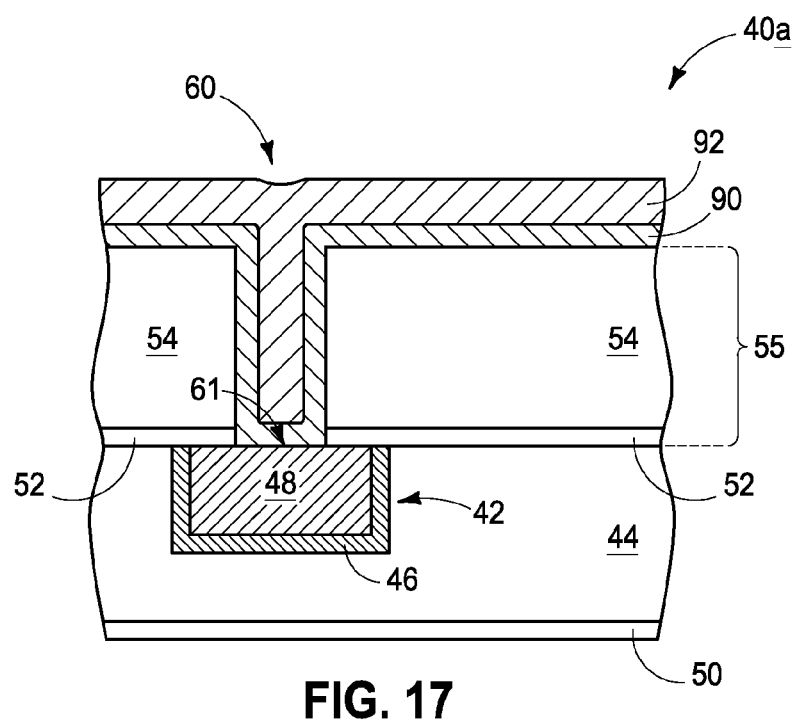
FIGS. 17-20 are diagrammatic cross-sectional views of a semiconductor construction at various process stages of another example embodiment. The process stage of FIG. 17 may follow that of FIG. 4.

Referring to FIG. 17, a construction 40a is shown at a processing stage which may follow that of FIG. 4 in some embodiments. The construction 40a comprises a first electrically conductive material 90 formed across the upper surface of insulative material 54 and within opening 60. The material 90 lines opening 60, and is directly against the upper surface 61 of electrically conductive structure 42. The electrically conductive material 90 may comprise any suitable composition or combination of compositions, including, for example, one or more of various metals, metal-containing compositions, and conductively-doped semiconductor materials. In some embodiments, it may be advantageous for material 90 to consist of titanium nitride, in that such may provide good adhesion to the upper surface of copper-containing material 48.

An electrically conductive material 92 is formed over material 90, and fills opening 60. Material 92 may comprise any suitable composition or combination of compositions; and may, for example, comprise one or more of various metals, metal-containing materials, and conductively-doped semiconductor materials. In some embodiments, material 92 may consist of tungsten, in that such may provide good conductivity.

Figure 18:
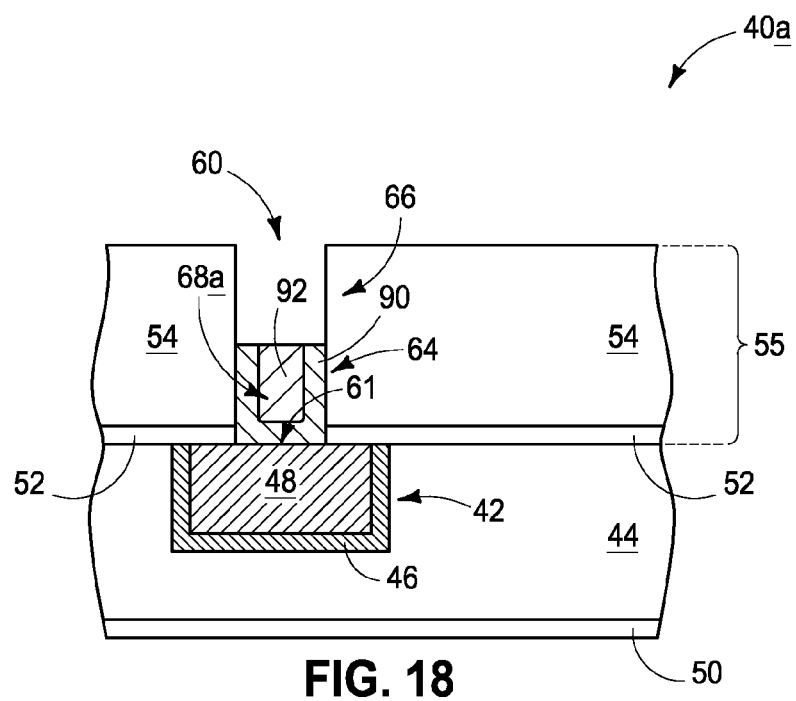

Referring to FIG. 18, materials 90 and 92 are recessed within opening 60 to form a plug 68a at the bottom region 64 of the opening, while leaving the top region 66 of the opening empty. The plug 68a of FIG. 18 is similar to the plug 68 described above with reference to FIG. 6, except that the plug 68a comprises two materials while plug 68 comprises only a single material. In some embodiments, the two materials 90 and 92 of plug 68a may both be metal-containing materials. Although plug 68a is shown comprising two materials, in other embodiments the plug may comprise more than two materials; and in some embodiments the plug may comprise more than two metal-containing materials.

In some embodiments, the illustrated plug 68a comprises material 90 consisting of titanium nitride directly against an upper surface 61 of copper-containing material 48, and comprises material 92 consisting of tungsten directly against the titanium nitride material 90.

In the shown embodiment, the recessed materials 90 and 92 together have a substantially planar upper surface. In other embodiments, the upper surface may be concave, convex, or of a roughened topography. If the topography has pinholes or voids extending therein, additional processing may be utilized to eliminate such features. For instance, planarization (for instance, chemical-mechanical polishing) may be conducted across material 92 prior to the recessing of materials 90 and 92.

Figure 19:
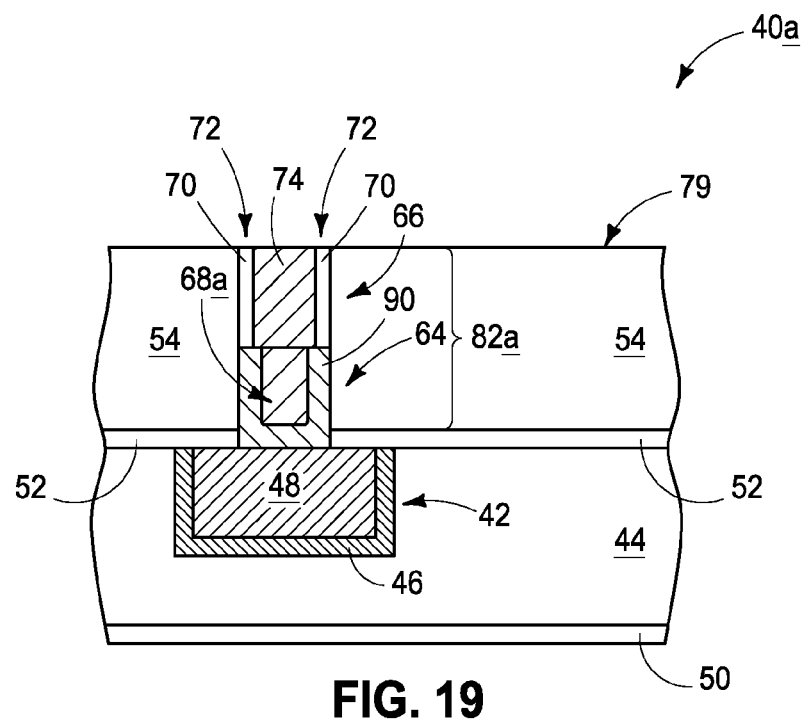

Referring to FIG. 19, processing analogous to that described above with reference to FIGS. 7-11 may be utilized to form spacer 72 over an outer portion of an upper surface of plug 68a, and to form electrically conductive material 74 directly against an inner portion of the upper surface of plug 68a. The plug 68a and material 74 together form an electrically conductive contact 82a analogous to the contact 82 described above with reference to FIGS. 15 and 16. The construction of FIG. 19 has a planarized upper surface 79.

Figure 20:
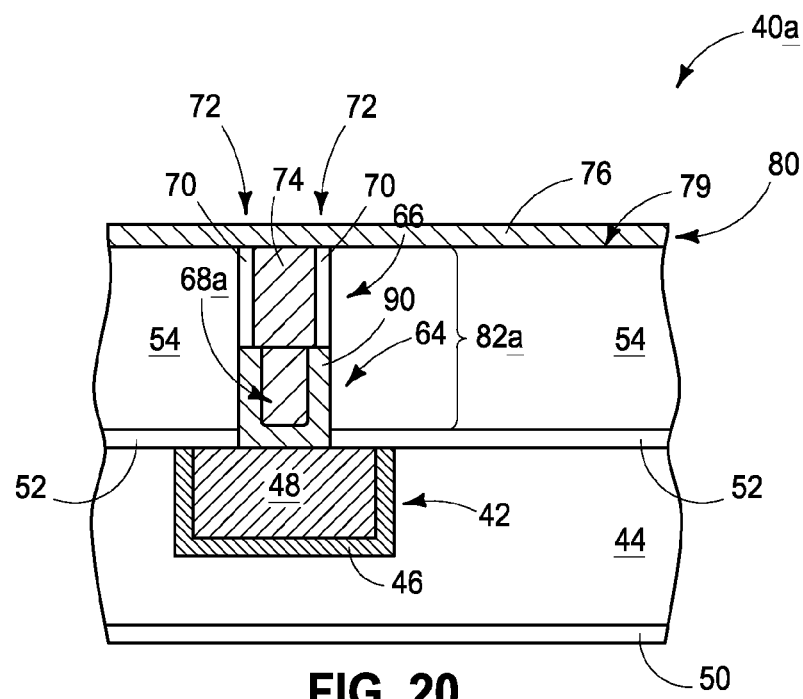

Referring to FIG. 20, processing analogous that described above with reference to FIGS. 12-14 may be utilized to form the conductive line 80 of material 76 over planarized surface 79. Such conductive line may be electrically coupled to the electrically conductive structure 42 through the electrically conductive contact 82a.

The single material plug 68 of FIG. 12 may be simpler to fabricate than the multi-material plug 68a of FIG. 20, which may be advantageous in some applications. In contrast, the multi-material plug 68a of FIG. 20 may be tailored for particular applications, and may, for example, have improved conductivity relative to the single material plug 68 of FIG. 12, which may be advantageous in some applications.

In some embodiments, material 74 may comprise two or more discrete compositions, and such compositions may be formed within the upper portion 66 of opening 60 (shown in, for example, FIG. 8) with processing analogous to that described in FIGS. 17 and 18 for forming the plug 68a of two or more discrete compositions.

The processing of FIGS. 3-20 removes conductive material 74 (FIG. 10) from over an upper surface of material 54 (FIG. 10) prior to forming the electrically conductive line 80 (FIG. 12). In other processing, conductive material 74 may remain over material 54 as part of the electrically conductive line. An example of such other processing is described with reference to FIGS. 21-25.

Figure 21:
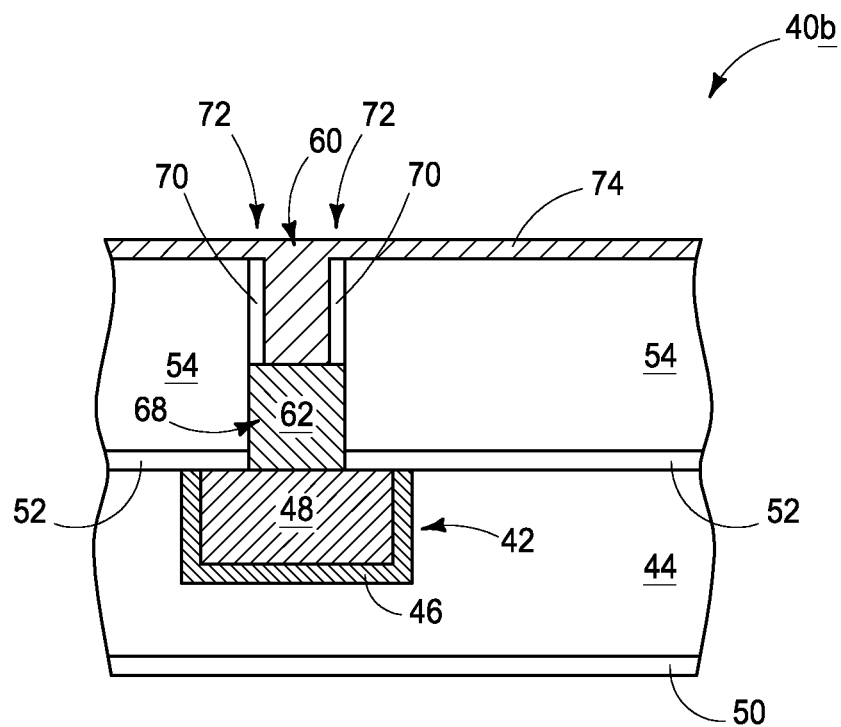
FIG. 21 is a diagrammatic cross-sectional view of a semiconductor construction at a process stage of another example embodiment. The process stage of FIG. 21 may follow that of FIG. 10.

Referring to FIG. 21, a construction 40b is shown at a processing stage which may follow that of FIG. 10 in some embodiments. The construction comprises material 74 extending across electrically insulative material 54, as well is within opening 60. The portion of material 74 over insulative material 54 has been thinned relative to the processing stage of FIG. 10. Such thinning may be accomplished utilizing planarization, such as CMP. The thinning of material 74 may be omitted in some embodiments.

Figure 22:
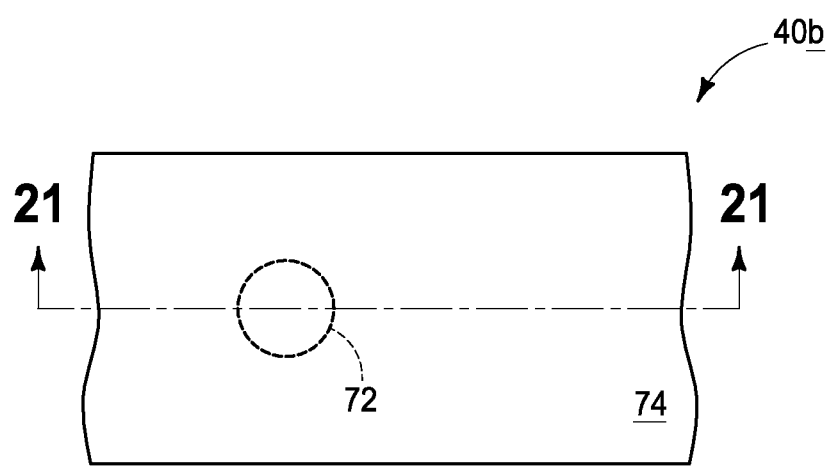
FIG. 22 is a diagrammatic top view of the construction of FIG. 21, with the construction of FIG. 21 being along the line 21-21 of FIG. 22.

FIG. 22 shows a top view of the construction of FIG. 21, and shows the material 74 extending entirely across an upper surface of the construction. An outer periphery of spacer 72 is shown in dashed-line view in FIG. 22.

Figure 23:
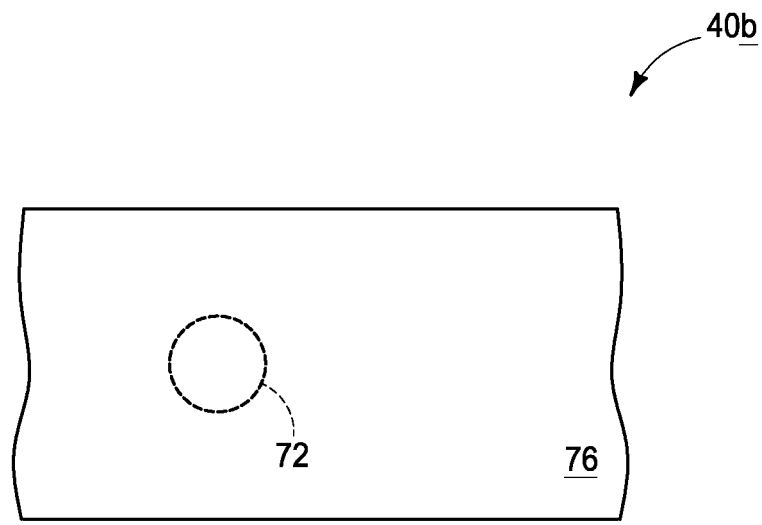
FIGS. 23 and 24 are diagrammatic top views of the construction of FIG. 22 shown at processing stages subsequent that of FIG. 22 in accordance with an example embodiment.

Referring to FIG. 23, the electrically conductive material 76 utilized in bitlines and wordlines (for instance, utilized in the line 80 of FIG. 12) is formed across the upper surface of construction 40b, and accordingly is formed over the material 74 of FIGS. 21 and 22.

Figure 24:
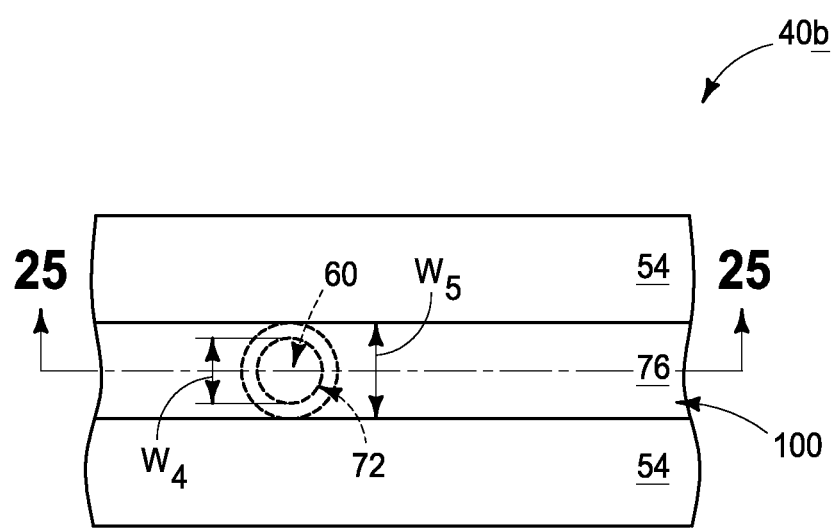
Figure 25:
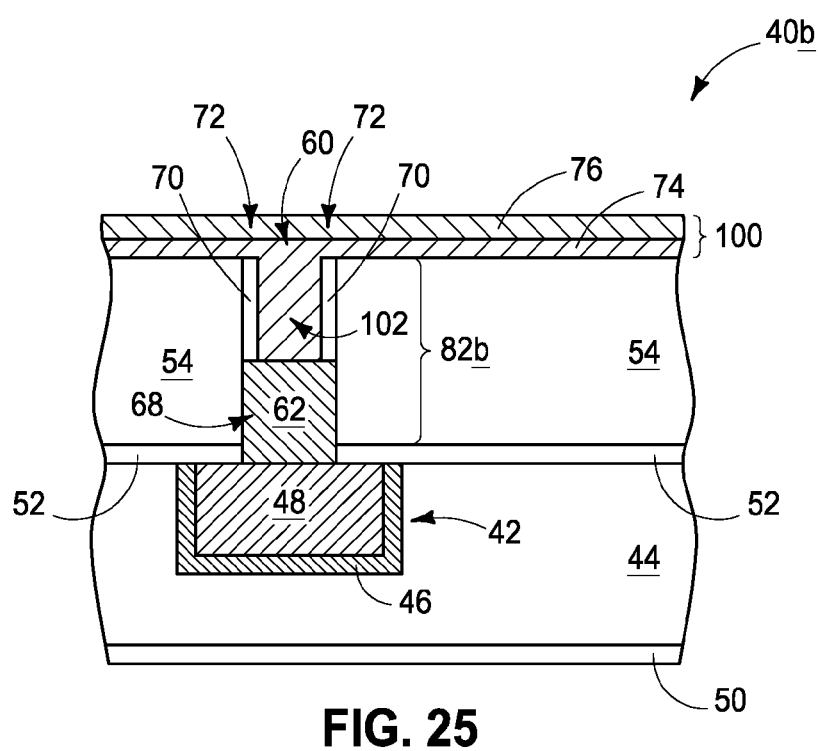
FIG. 25 is a cross-sectional side view of the construction of FIG. 24, with the view of FIG. 25 being along the line 25-25 of FIG. 24.

Referring to FIGS. 24 and 25, the materials 76 and 74 are patterned into a line 100 analogous to the line 80 of FIG. 12. Such patterning may be accomplished with methodology analogous that described above with reference to FIGS. 13 and 14. The line 100 may be utilized as a bitline or a wordline of a memory array, analogous to the utilization of line 80 in memory arrays as described above with reference to FIGS. 15 and 16. In some embodiments, the line 100 may be considered to comprise electrically conductive materials 74 and 76 extending across a region 102 of the electrically conductive material 74 within opening 60. Such region of the electrically conductive material 74, together with the electrically conductive plug 68, forms an electrically conductive contact 82b which electrically couples line 100 with the electrically conductive structure 42.

The spacer 72 is diagrammatically illustrated in FIG. 24, and the narrowed upper region of opening 60 is diagrammatically shown to be laterally contained by such spacer. The narrowed upper region of opening 60 has a first width, $W_4$, and the line 100 has a second width, $W_5$, greater than such first width. In some embodiments, line 74 is representative of a series of conductive lines formed along a pitch; and the first width, $W_4$, may be less than one-half of such pitch. This may be beneficial in numerous applications, including, for example, bitline applications, signal bus applications, etc.

Although the processing of FIGS. 21-25 is described utilizing a plug 68 having a single material (i.e., a plug of the type described in the embodiment of FIG. 12), analogous processing may be utilized with plugs having two or more materials (for instance, a plug 68a of the type described in the embodiment of FIG. 20). Also, although material 74 is shown to comprise a single homogenous composition, in other embodiments material 74 may comprise two or more discrete compositions.

The various embodiments described above may enable improved uniformity of contact performance and dimensions to be achieved across a wafer than is achieved with conventional processing, and may enable electrical coupling between tightly-pitched structures and more loosely-pitched structures without consuming semiconductor real estate in shark jaw structures or other architectures associated with such coupling in conventional architectures.

The electronic structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present. A structure is "directly above" another structure when at least a portion of it is vertically aligned with the other structure; and, in contrast, can be "above" another structure without being vertically aligned with said other structure.

Some embodiments include a method of forming an electrically conductive contact. An opening is formed through an electrically insulative material to an electrically conductive structure. An electrically conductive plug is formed within a bottom region of the opening. A spacer is formed to line a lateral periphery of an upper region of the opening. The spacer is over an outer portion of an upper surface of the electrically conductive plug and leaves an inner portion of the upper surface exposed. An electrically conductive material is formed within the lined upper region of the opening and directly against the inner portion of the upper surface of the electrically conductive plug. An electrically conductive line is formed to extend across the electrically insulative material and the electrically conductive material within the opening, and to be electrically coupled with the electrically conductive material within the opening.

Some embodiments include a method of forming an electrically conductive contact. A stack is provided over a copper-containing material. The stack comprises an electrically insulative material over an electrically insulative copper barrier material. An opening is formed through the stack to the copper-containing material. An electrically conductive plug is formed within a bottom region of the opening. A spacer is formed to line a lateral periphery of an upper region of the opening. The spacer is over an outer portion of an upper surface of the electrically conductive plug and leaves an inner portion of the upper surface exposed. An electrically conductive material is formed within the lined upper region of the opening and directly against the inner portion of the upper surface of the electrically conductive plug.

Some embodiments include a method of forming an electrically conductive contact. An opening is formed through an electrically insulative material to an electrically conductive material. An electrically conductive plug is formed within a bottom region of the opening. A spacer is formed along a lateral periphery of an upper region of the opening to narrow the upper region of the opening. The spacer is over an outer portion of an upper surface of the electrically conductive plug and leaves an inner portion of the upper surface exposed. An electrically conductive material is formed over the electrically insulative material and within the narrowed upper region of the opening. The electrically conductive material is directly against the inner portion of the upper surface of the electrically conductive plug. The electrically conductive material is patterned into a line that extends across the stack and across a region of the electrically conductive material within the opening.

Some embodiments include a method of forming an electrically conductive contact. An opening is formed through an electrically insulative material to an electrically conductive material. An electrically conductive plug is formed within a bottom region of the opening. A spacer is formed along a lateral periphery of an upper region of the opening to narrow the upper region of the opening. The spacer is over an outer portion of an upper surface of the electrically conductive plug and leaves an inner portion of the upper surface exposed. An electrically conductive material is formed over the electrically insulative material and within the narrowed upper region of the opening. The electrically conductive material is directly against the inner portion of the upper surface of the electrically conductive plug. A planarized surface is formed to extend across the electrically conductive material and the electrically insulative material.

Some embodiments include a semiconductor construction having an electrically conductive plug over and directly against an electrically conductive structure. The electrically conductive plug has a first width along a cross-section. An electrically insulative spacer is over and directly against the electrically conductive plug. The spacer is directly above an outer portion of an upper surface of the electrically conductive plug and not directly above an inner portion of the upper surface of the electrically conductive plug. The inner portion has a second width along the cross-section. The second width is less than the first width. The spacer and electrically conductive plug have outer lateral surfaces against an electrically insulative material. An electrically conductive material is over and directly against the inner portion of the upper surface of the electrically conductive plug, and directly against an inner lateral surface of the spacer. An electrically conductive line extends across the electrically insulative material and the electrically conductive material, and is electrically coupled to the electrically conductive structure through the electrically conductive material and the electrically conductive plug.

Some embodiments include a semiconductor construction having a stack over a copper-containing material. The stack comprises an electrically insulative material over an electrically insulative copper barrier material. An electrically conductive plug is within the stack and directly against the copper-containing material. An electrically insulative spacer is within the stack. The electrically insulative spacer is over and directly against an outer portion of an upper surface of the electrically conductive plug and not directly above over an inner portion of the upper surface. An electrically conductive material is over and directly against the inner portion of the upper surface of the electrically conductive plug. The electrically conductive material is directly against an inner lateral surface of the spacer.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A semiconductor construction, comprising:
    a copper-containing material supported by a silicon-containing base,
    a stack over the copper-containing material, the stack comprising a first insulative material over an insulative copper barrier material;
    a conductive plug within the stack and directly against the copper-containing material;
    an insulative spacer within the stack; the insulative spacer being over and directly against an outer portion of an upper surface of the conductive plug and not directly above an inner portion of the upper surface;
    a conductive material over and directly against the inner portion of the upper surface of the conductive plug; the conductive material being directly against an inner lateral surface of the spacer; and
    wherein the conductive plug comprises titanium nitride directly against the copper-containing material, and comprises tungsten directly against the titanium nitride.

2. The semiconductor construction of claim 1 wherein the insulative spacer comprises silicon dioxide.

3. The semiconductor construction of claim 1 wherein the insulative spacer comprises silicon nitride.

4. The semiconductor construction of claim 1 wherein the conductive material comprises metal.

5. A semiconductor construction, comprising:
    a stack over a first conductive material, the stack comprising a second insulative material over a first insulative material; the first and second insulative materials being compositionally different from one another;
    a conductive plug within the stack and on the first conductive material, the conductive plug having a lateral sidewall directly against both the first and second insulative materials;
    an insulative spacer over and directly against an outer portion of an upper surface of the conductive plug and not directly above an inner portion of the upper surface, the insulative spacer having an outer lateral surface directly against the second insulative material of the stack and not directly against the first insulative material of the stack;
    a second conductive material over and directly against the inner portion of the upper surface of the conductive plug; the second conductive material being directly against an inner lateral surface of the spacer;

the second conductive material extending along an upper surface of the stack and forming a lower part of a conductive line; and a third conductive material directly over and along the second conductive material and forming an upper part of the conductive line, the second and third conductive materials being compositionally different from one another.

6. The semiconductor construction of claim 5 wherein the first conductive material is a copper-containing material, and wherein the first insulative material of the stack is a copper barrier material.

7. The semiconductor construction of claim 5 wherein the conductive plug comprises only a single conductive material.

8. The semiconductor construction of claim 5 wherein the conductive plug comprises two or more conductive materials.

9. The semiconductor construction of claim 5 wherein the conductive plug comprises one or both of tungsten and titanium.

10. The semiconductor construction of claim 5 wherein the conductive plug comprises one or more of metal nitride, metal silicide and metal carbide.

11. The semiconductor construction of claim 5 wherein the conductive plug comprises conductively-doped semiconductor material.

12. A method of forming a conductive contact, comprising:
    forming an opening through an insulative material to a conductive structure;
    forming a conductive plug within a bottom region of the opening and directly against the conductive structure;
    forming a spacer to line a lateral periphery of an upper region of the opening; the spacer being over and directly against an outer portion of an upper surface of the conductive plug and leaving an inner portion of the upper surface exposed;
    forming a conductive material within the lined upper region of the opening and directly against the inner portion of the upper surface of the conductive plug;
    forming a conductive line which extends across the insulative material and which is electrically coupled with the conductive structure through the conductive material within the opening; and
    wherein the conductive plug comprises titanium nitride directly against copper of the conductive structure, and comprises tungsten directly against the titanium nitride.

13. The method of claim 12 wherein the conductive material comprises metal.

14. The method of claim 12 wherein the conductive line is a bitline or a wordline, and is incorporated into a memory array.

15. The method of claim 14 wherein the memory array is an RRAM array.

16. A method of forming a conductive contact, comprising:
    forming an opening through an insulative material to a metal-containing conductive structure;
    forming a metal-containing conductive plug within a bottom region of the opening;
    forming a spacer along a lateral periphery of an upper region of the opening to narrow the upper region of the opening; the spacer being over an outer portion of an upper surface of the metal-containing conductive plug and leaving an inner portion of the upper surface exposed;
    forming a conductive material over the insulative material and within the narrowed upper region of the opening; the conductive material being directly against the inner portion of the upper surface of the metal-containing conductive plug; and
    patterning the conductive material into a conductive line that extends across the insulative material and across a region of the conductive material within the opening.

17. The method of claim 16 wherein the narrowed upper region of the opening comprises a first width, and wherein the conductive line has a second width across the opening, with the second width being larger than the first width.

18. The method of claim 16 wherein the conductive line is a bitline or a wordline, and is incorporated into a memory array; and wherein the memory array is an RRAM array.

* * * * *